US006481001B1

(12) United States Patent
Moore

(10) Patent No.: US 6,481,001 B1
(45) Date of Patent: Nov. 12, 2002

(54) METHOD AND SYSTEM FOR PROACTIVELY DEBUGGING FITTING PROBLEMS IN PROGRAMMABLE LOGIC DEVICES

(75) Inventor: Michael Timothy Moore, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/563,233

(22) Filed: May 2, 2000

(51) Int. Cl.[7] ............................................... G06F 17/50
(52) U.S. Cl. ........................................... 716/18; 716/17
(58) Field of Search ................................ 716/1–21, 17, 716/18; 714/33, 703, 718, 735–738, 740; 703/15; 702/187; 326/38

(56) References Cited

U.S. PATENT DOCUMENTS 5,633,813 A * 5/1997 Srinivasan .................... 703/14

* cited by examiner

Primary Examiner—Matthew Smith
Assistant Examiner—Naum B Levin
(74) Attorney, Agent, or Firm—Wagner Murabito & Hao LLP

(57) ABSTRACT

A method and system for automatically proactively debugging fitting problems in programmable devices. Automatic fitters are computer programs that place and route circuit resources within a programmable device, e.g., a complex programmable logic device (CPLD) to determine the resources used and timing for a given hardware design. Upon a fitting failure for an IC or hardware design, an embodiment first may identify any specific architectural information, if any, causing the failure and may advise the user including solution recommendations. Second, an embodiment obtains a larger device having the same pin package, if available, or a virtual device, and may perform a second fitting on the hardware design but using this larger device. If this fits properly, then the resulting pin assignment is fixed and a third fitting may be performed on the smaller device with the fixed pin assignment. If this fails, further architectural violations are identified and solution recommendations are given to the user. If there are no larger devices that can be used with the hardware design and/or the third fitting does not obtain a proper result, then an embodiment determines if specific named pins are failing to fit. If these pins are identified, and the user has not locked them down, then they may be allowed to float and fitting is performed once more. If no solution can be reached after the above attempts, then an embodiment informs the user that technical support is required and a history of the fitting attempts may be recorded. A programming file may be generated on a successful fit.

20 Claims, 6 Drawing Sheets

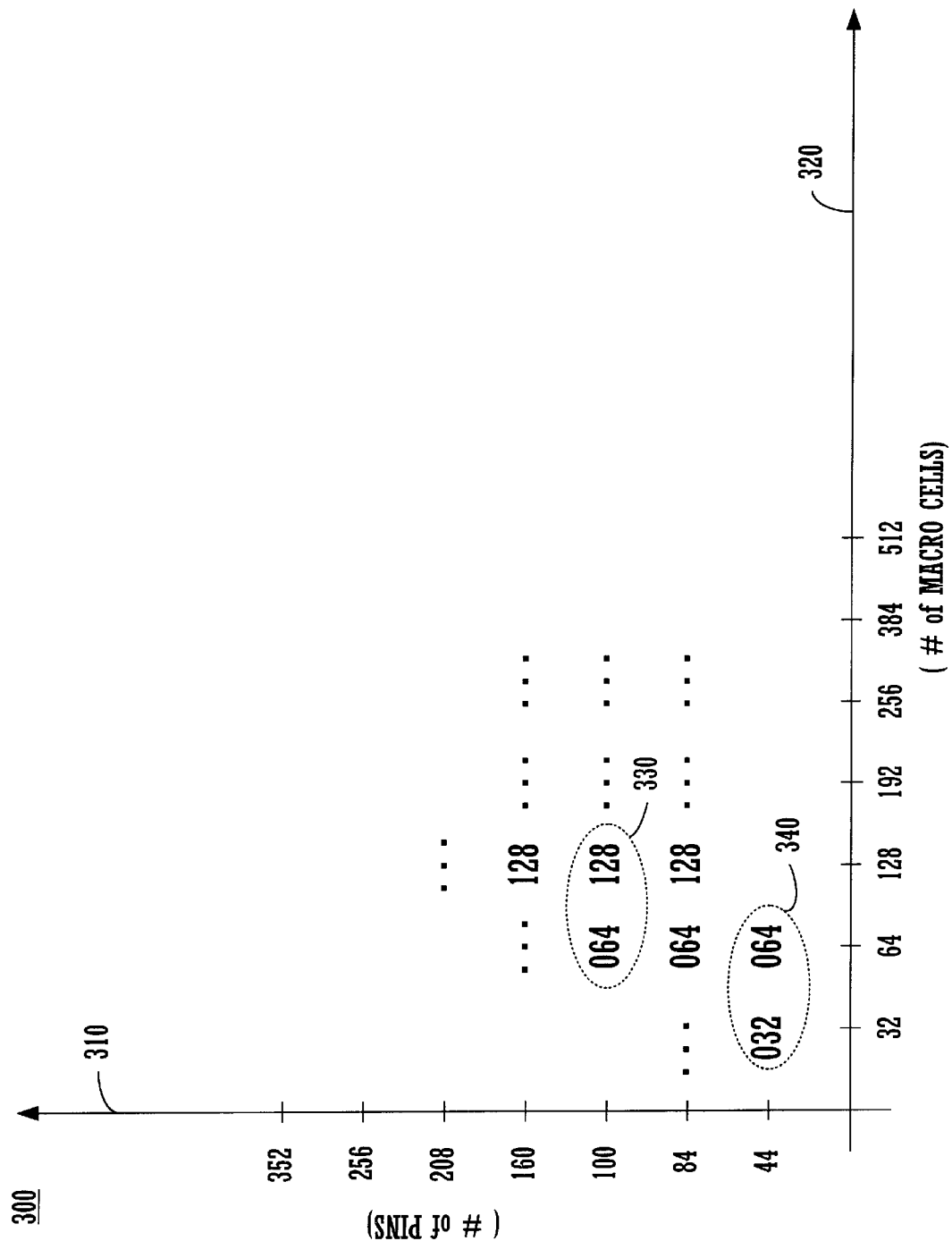

260 cont.

METHOD AND SYSTEM FOR PROACTIVELY DEBUGGING FITTING PROBLEMS IN PROGRAMMABLE LOGIC DEVICES

BACKGROUND OF THE INVENTION

1. Field of the Invention

The present invention relates to the field of automatic design automation (EDA) technology. More specifically, the present invention relates to an improvement to computer implemented fitting programs that are used to automatically place and route resources of a programmable logic device with respect to a given programmable logic device (PLD) design. The improvements include proactive debugging of fitting problems.

2. Related Art

Electronic design automation (EDA) systems allow designers of integrated circuit (IC) devices, and also designers who want to implement a design on a programmable logic device (PLD), to use high level language (HDL) descriptions to represent their IC or PLD designs (e.g., hardware designs) at an abstract or high level. In addition to HDL, the design descriptors can also include any method of representing a hardware design, such as schematic, combination and others. These schematic or HDL descriptions are then synthesized by computer implemented processes that generate technology dependent descriptions of the IC or PLD design called "netlists." The PLD chip can be a programmable logic device, such as a complex programmable logic device (CPLD), or a field programmable logic array (FPGA). These programmable logic devices contain generic functional modules that can be electrically coupled together and programmed to perform certain functions and generate specific signals such that an IC or PLD design can be realized in hardware.

Part of the design process for programmable logic devices includes processes called "fitting." Fitting processes are used to fit the IC or PLD design to the programmable logic device and these processes include determining the PLD resources that are used and also determining the required timing. Fitting processes are also commonly called "place and route" processes. The end result of fitting, with respect to CPLDs, is a programming file, e.g., JEDEC file or bitstream file, for the CPLD device. When programmed using the programming file, the CPLD implements the IC or PLD design in hardware.

All CPLDs have architectural limitations which cannot be violated or the IC or PLD design will not successfully fit to the CPLD device. If architectural limitations are violated, then fitting problems occur within the fitting process. However, conventional fitter software frequently does not give an accurate description as to the root cause of any discovered fitting programs and often does not give any information as to the cause or reason for fitting problems. This can be very frustrating for the designer trying to debug an IC or PLD design that fails to fit to particular CPLD device.

As a result, when faced with troublesome fitting programs, it is often the case that an IC or PLD designer contacts an applications hotline engineer that is familiar with the CPLD device. The applications hotline engineer then examines the IC or PLD design and manually applies debugging processes to address any fitting problems and manually suggests possible fixes. However, this approach slows the user's design cycle because the design cycle is typically placed on hold while the IC or PLD designers wait for the applications engineer to fix the problem. This approach also creates a large burden for the application engineering group because user inquiries need to be personally addressed. This approach can also be error prone because it relies on the manual application of debugging techniques to the fitting problems. Further, this approach relies on the experience level of the applications engineers and some engineers have more knowledge of certain CPLDs than others. Another disadvantage of this approach is that fitting errors can make the fitter software look inadequate to the user, and can cause stress to users who do not fully understand the architecture of CPLDs.

SUMMARY OF THE INVENTION

Accordingly, what is needed is a system and method for proactively debugging fitting problems that can arise in the programming processes of programmable logic devices, such as CPLDs. What is needed further is an automatic system and method for proactively debugging fitting problems that also eliminate or minimize delay in the design cycle for users and also that can be used to reduce the workload burden on the application engineering groups of CPLD or other PLD suppliers. These and other advantages of the present invention not specifically recited above will become clear within discussions of the present invention presented herein.

A method and system are described herein for automatically proactively debugging fitting problems in programmable devices. Automatic fitters are computer programs that place and route circuit resources within a programmable device, e.g., a complex programmable logic device (CPLD) to determine the resources used and timing for a given integrated circuit (IC) or PLD design. Upon a fitting failure for an IC or PLD design, an embodiment of the present invention first identifies any specific architectural information, if any, causing the failure and may advise the user including solution recommendations. Second, an embodiment of the invention obtains a larger device (includes larger virtual device) having the same pin package as the original design choice, if available, and performs a second fitting on the IC or PLD design but using this larger device.

If this fits properly, then the resulting pin assignment is fixed and a third fitting may be performed on the smaller device with the fixed pin assignment. If this fails, this frequently can be used to draw further information from the fitting process and any further architectural violations may be identified and solution recommendations are given to the user. If there are no larger devices that can be used with the IC or PLD design and/or the third fitting does not obtain a proper result, then an embodiment of the invention uses virtual devices. If this does not work, then an embodiment of the present invention may determine if specific named pins are failing to fit. If these pins are identified, and the user has not locked them down, then they are allowed to float and fitting is performed once more. If no solution can be reached after the above attempts, then the invention may inform the user that technical support is required and a history of the fitting attempts is recorded. This can automatically be provided to the applications hotline by an automatic email from the fitter software. A programming file may be generated upon a successful fit.

More specifically, an embodiment of the present invention includes a method of debugging fitting problems comprising the steps of: a) in response to an integrated circuit (PLD)

design failing a first fitting on a first programmable device, automatically selecting a second programmable device having more resources than the first programmable device but having a same pin package; b) automatically performing a second fitting of the PLD design on the second programmable device which, if successful, yields a determined pin assignment; and c) automatically performing a third fitting of the PLD design on the first programmable device and constrained by the determined pin assignment. Embodiments include the above and further comprising the steps of: automatically reporting any discovered architectural violations and their suggested solutions; provided the third fitting generates fitting problems, identifying select pins that fail fitting; and provided the select pins that fail fitting are not locked down, automatically performing a fourth fitting of the PLD design on the first programmable device and constrained by the determined pin assignment but floating the select pins that fail fitting.

Embodiments include the above and further comprising the steps of: provided the third fitting generates fitting problems, identifying any newly discovered architectural violations; and automatically reporting the any newly discovered architectural violations and their suggested solutions. Embodiments also include a system implemented in accordance with the above.

BRIEF DESCRIPTION OF THE DRAWINGS

FIG. 3 is a graph illustrating exemplary families of programmable logic devices, e.g., CPLDs, that have different numbers of internal resources (e.g., macrocells) but have the same external pin package.

DETAILED DESCRIPTION OF THE INVENTION

In the following detailed description of the present invention, an automatic proactive debugging process and system for fitting problems that arise in the programming of a programmable logic device, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "scrolling" or "displaying" or "recognizing" or "synthesizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Electronic Design Automation System

Figure 1:
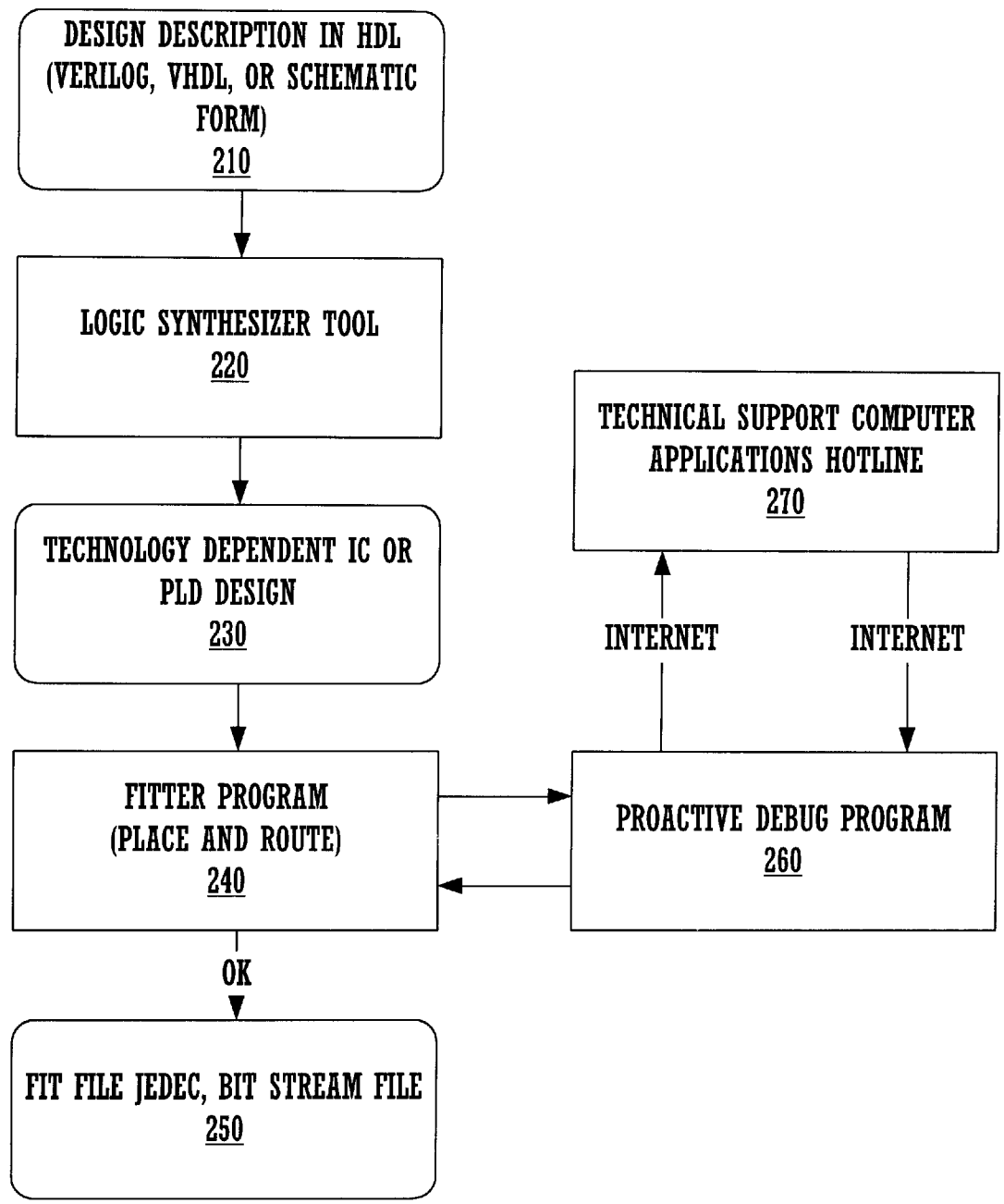
FIG. 1 illustrates a electronic design automation (EDA) system in accordance with an embodiment of the present invention.

FIG. 1 illustrates an EDA system 200 in accordance with an embodiment of the present invention. System 200 includes a logic synthesizer 220 that may accept an integrated circuit design description in a high level description language (HDL) 210, e.g., VHDL or Verilog, etc., or a schematic format can be used. The logic synthesizer 220 may be a well known process and any of a number of well known and commercially available synthesizers can be used, e.g., several are commercially available from Synopsys, Inc. of Mountain View, Calif. The output of the logic synthesizer 220 is a technology dependent integrated circuit design or "netlist" 230. This design description 230 is gate-level and can be any of a number of well known formats. Design description 230 is used as an input to a fitter process 240 which is a computer implemented program.

The fitter process 240 is designed to implement the netlist design 230 onto a programmable logic device, e.g., "fit" the design to the device. The programmable logic devices used in accordance with embodiments of the present invention may be programmable logic devices, such as a complex programmable logic devices (CPLDs) or field programmable gate arrays (FPGAs). The fitter program 240 may determine the resources that need to be used in order to implement the PLD design 230 and may determine the required timing, and also may route signals between resources and to external pins of the programmable logic device. The term "fitting" means, in one embodiment, to take a gate-level netlist (or similar) and map its functionality to a given PLD architecture and to generate a programming file that implements the design into the actual PLD. The fitter program 240 can also be called a "place and route" process.

Figure 4A:
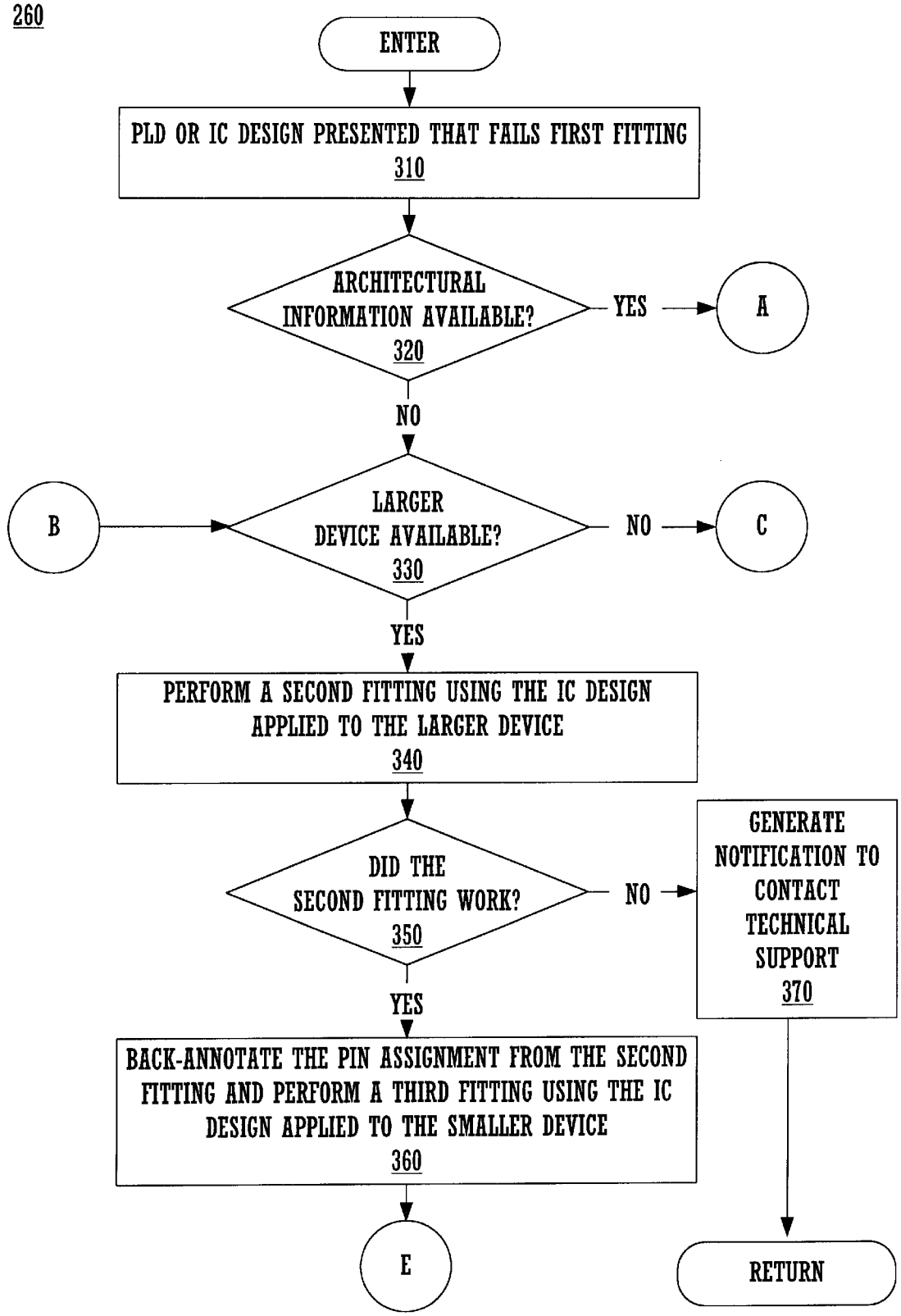
FIG. 4A, FIG. 4B and FIG. 4C are flow diagrams of an automatic proactive debugging process for a fitter program in accordance with one embodiment of the present invention.
Figure 4B:
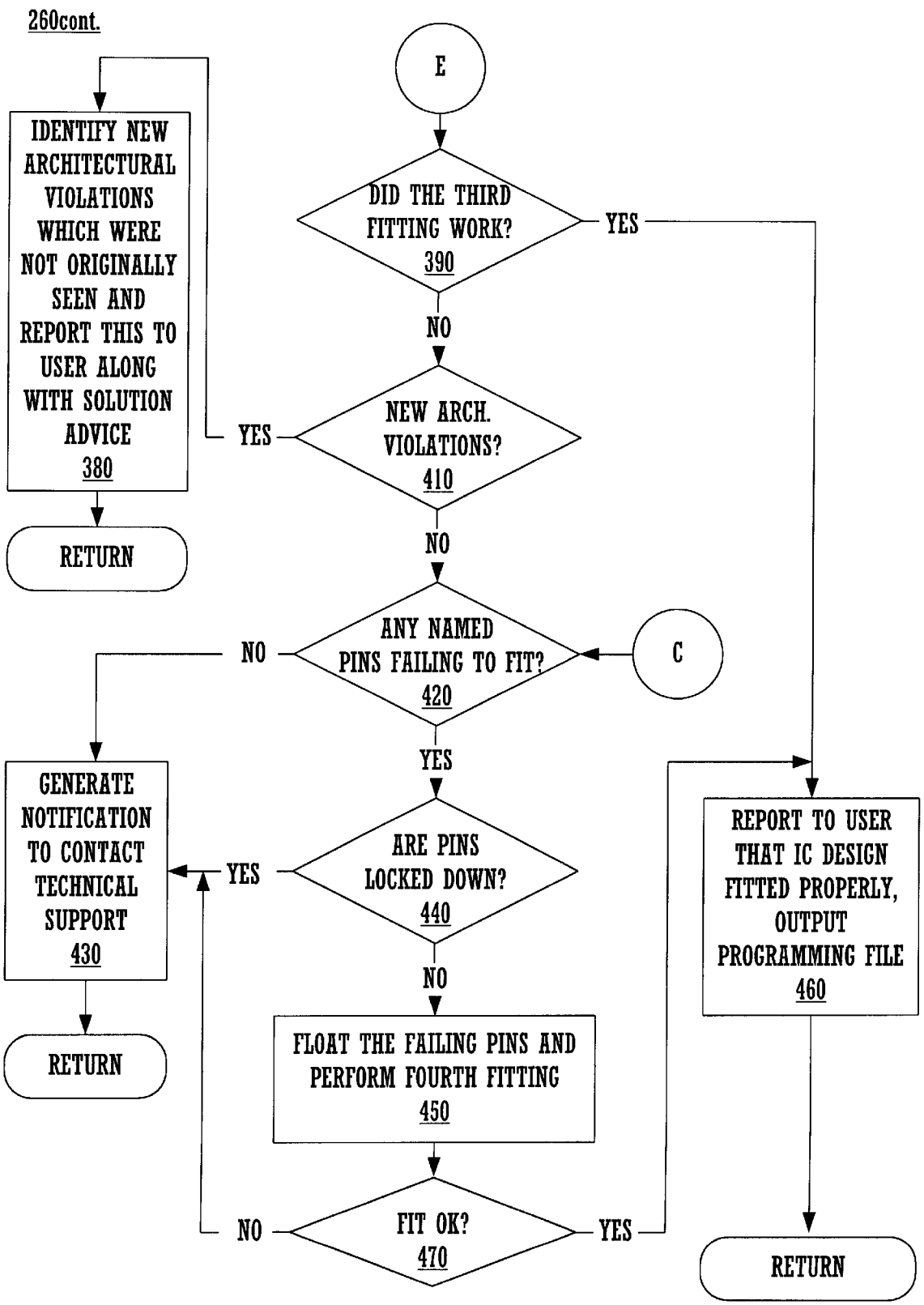
Figure 4C:
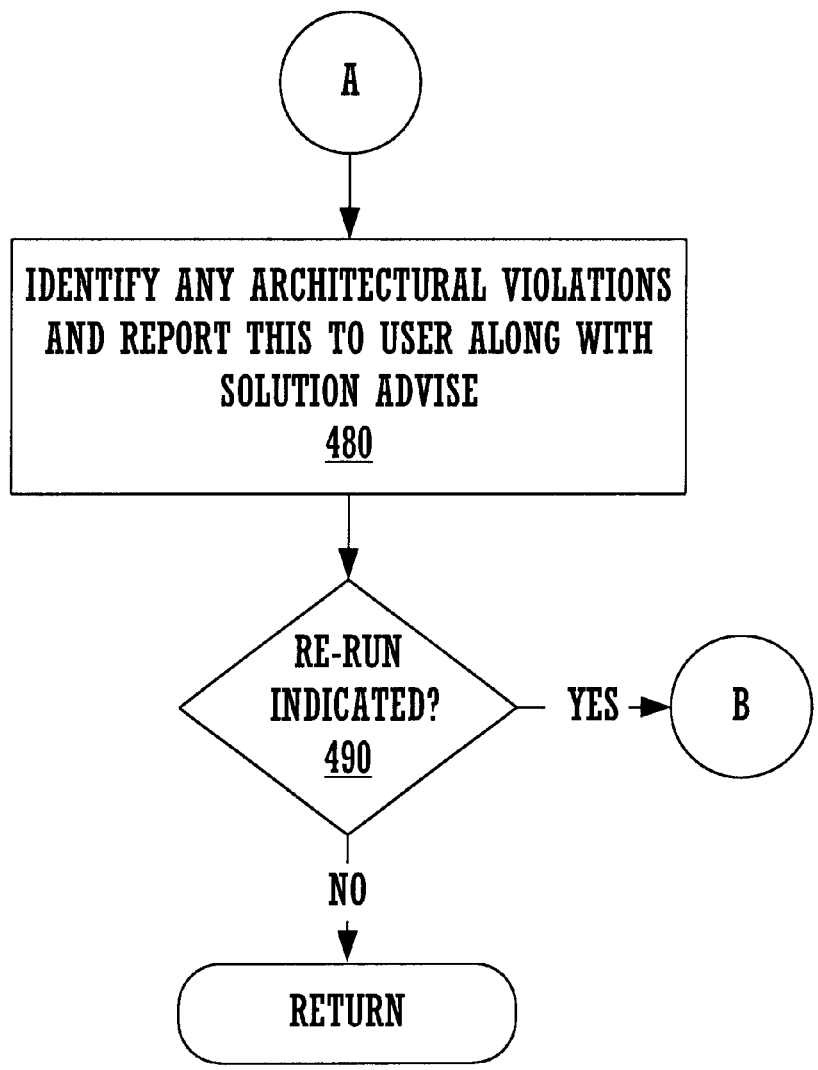

Frequently during the design process, the PLD design 230 fails the fitting process 240 and, as a result, one or more fitting problems arise. Upon a fitting problem, a proactive debugging process 260 may be invoked in accordance with one embodiment of the present invention. The proactive debugging process 260 is designed to determine possible causes of the fitting problem(s) and then automatically take corrective action to properly fit the design 230 to the selected programmable logic device. If the debug process 260 and the fitter 240 are able determine a proper fit, then a fit file or a "programming" file 250 may be generated and stored in computer readable memory. This file 250 can be any of a number of well known formats, e.g., the JEDEC format or a bit stream format, etc. In the event that a fit is not able to be found by debug program 260, the user may be flagged that technical support 270 should be contacted regarding the fitting problem, e.g., by using an Internet connection. It is appreciated that FIG. 4A, FIG. 4B and FIG. 4C illustrate steps performed by the proactive debug program 260 in accordance with an embodiment of the present invention. Other embodiments of the invention may include one or more steps alone or in combination.

In one embodiment, the debugger 260 performs the following functionality. When an PLD design fails to fit, and the fitter 240 cannot report the specific architectural violations that caused the failure, the debugger 260 then may attempt to fit the PLD design to the next higher density PLD that shares the same pin package as the original PLD. If this is successful, then the debuffer 260 may back-annotate (lock) the pin-out and may attempt to fit the original lower density PLD with this pin-out. If any violations still exist, the fitter may identify the architectural violations and the pins that are causing them. The fitter then may automatically float the offending pins (and others using the same architectural features) at attempts to re-fit. If the design still does not fit, then the fitter may report the cause of the problem, and intelligently suggest to the user as to how he/she can prevent the problems by modifying the design, or using a higher density PLD.

By proactively debugging the fitting process, the present invention reduces the number of times that a user needs to contact technical support teams thereby speeding up the design cycle. Another advantage of proactively debugging is that the user becomes more aware of how to design using the programmable device architecture, e.g., the CPLD architecture.

Figure 2:
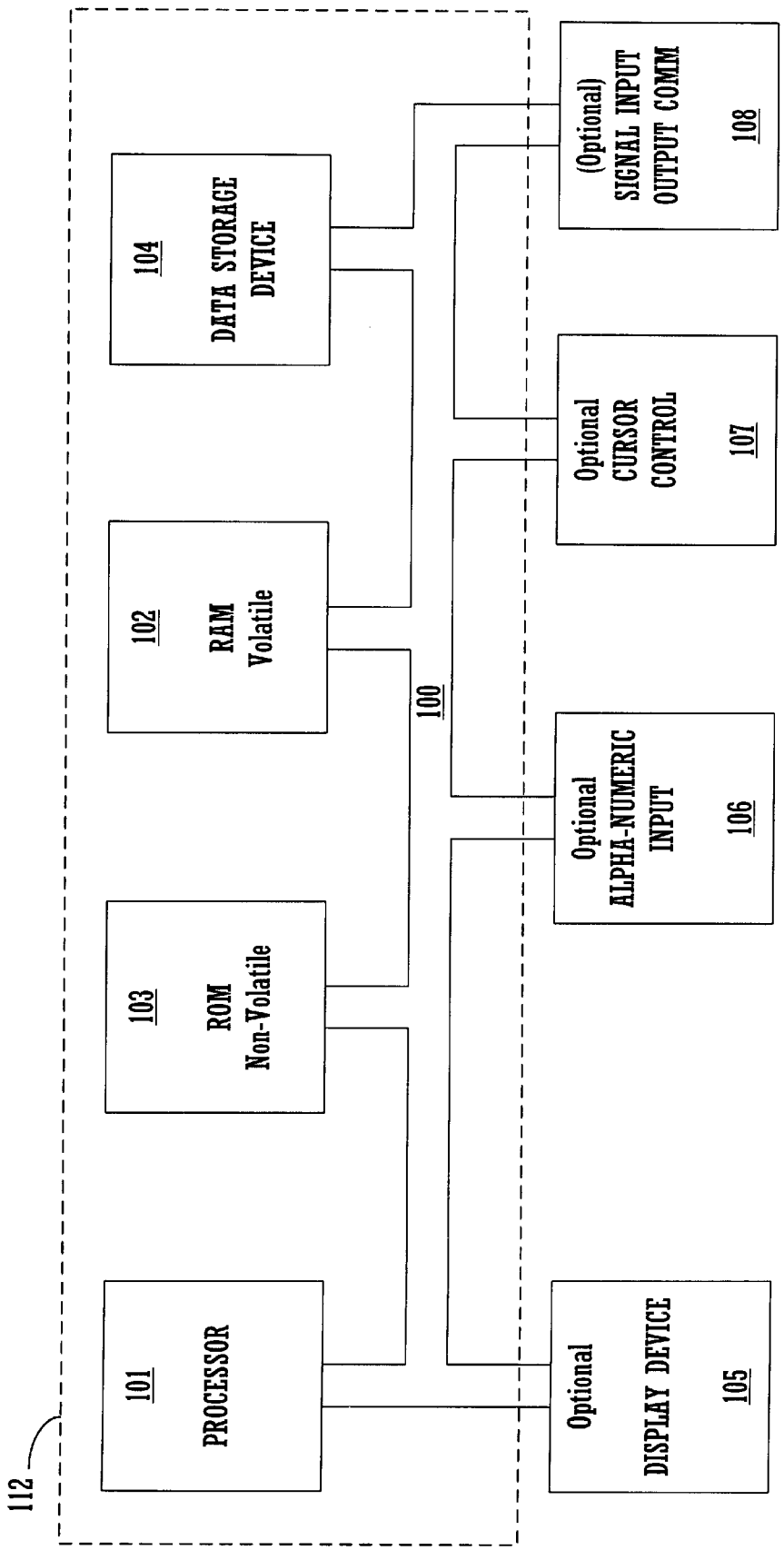
FIG. 2 illustrates a computer aided design (CAD) system which can operate as a platform for embodiments of the present invention.

FIG. 2 illustrates a computer aided design (CAD) system 112 which can act as a computer platform for the proactive debugging process 260 of the present invention. In one embodiment, the CAD system 112 is a general purpose computer system and includes an address/data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101. System 112 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

FIG. 3 illustrates that many families of CPLDs have the same pin package, but offer different numbers of internal resources, e.g., different numbers of macrocells. In other words, CPLD devices are available in families in which devices of different densities share overlapping pin-outs. This is typically done so that if a user selects a pin package and a particular device, and then their design outgrows that device, the user can migrate to the next highest density with the same pin package. The pin package represents the number of externally available pins used by the CPLD device. In the graph 300, the number of pins are listed on the vertical 310 and the number of macrocells are listed along the horizontal 320. As shown by 340, the "032" product family (e.g., CY 37032) supports a 44 pin package having 32 macrocells but the "064" family (e.g., CY 37064) also supports a 44 pin package but offers 64 macrocells instead. Likewise, as shown by 330, the "064" product family supports a 100 pin package having 64 macrocells but the "128" family (e.g., CY 37128) also supports a 100 pin package but offers 128 macrocells instead.

FIG. 4A illustrates an embodiment of the automatic proactive debugging process 260. The process 260 can be realized as instruction code stored in computer readable memory units and executed by a processor. At step 310, an PLD design is accessed that the filter process 240 (FIG. 1) failed to fit with respect to a first PLD. At step 320, the present invention may determine if any architectural information, e.g., architectural limitations, was generated from the fitter process 240 as to the identity of the cause of the fitting problems. Architectural limitations are provided for each PLD and they outline design rules based on the resources available within the device. A few examples of architectural limitations are given below.

One design rule specifies the maximum number of product terms (PTs) that can fit into a given logic block. If more than that number of PTs are used in the PLD design 230, an architectural violation is reported. Another design rule specifies the maximum number of product term clocks that can fit into a given logic block. If more than that number of product term clocks are used, an architectural violation is reported. Another design rule specifies the maximum number of output enables (OEs) that can fit within a given logic block. If more than that number of OEs are used in the PLD design 230, an architectural violation is reported. Yet another design rule specifies the maximum number of asynchronous resets (ARs) that can fit within a given logic block. If more than that number of ARs are used in the PLD design 230, an architectural violation is reported. One design rule specifies the maximum number of product terms (PTs) that can be routed into a given macrocell. If more than that number of PTs are used in the PLD design 230, an architectural violation is reported. Other architectural limitations specify the maximum number of pins in the PLD package.

Architectural limitations can be violated with respect to a signal that cannot be assigned into a single logic block (requiring a sum split). Architectural limitations also arise when the design cannot fit a particular device size, e.g., due to too many sum splits or due to lack of sufficient logic resources on the device. The above listing is exemplary only. It is appreciated that other PLD architectures may have different features and limitations and as a result may have different types of fitting problems in addition to the ones described above. The term "sum split" describes where a section of logic is too big to fit in a single logic block of the design and this section is segmented into two or more logic blocks. The fitter usually does this automatically, but sometimes requires manual intervention by the user to optimize the results.

At step 320 of FIG. 4A, if architectural information is not available, then step 330 may be entered. Otherwise, if architectural information is available then process 260 may proceed to step 480 of FIG. 4C. At step 480, an embodiment of the present invention automatically identifies any present architectural information concerning the fitting problems and generates a report for the designer (user) to inspect. The report also includes advice or solution recommendations that the designer can use to identify the cause of the fitting problems so that they can be corrected. Namely, recommendations may be automatically given to the user on how to avoid fitting problems when designing for PLDs. For instance, if more outputs were specified in the PLD design 230 than are available in the first PLD, the advice given at step 480 could be for the designer to reduce the number of outputs/inputs used by the amount that exceeded the maximum number. Further, if the PLD design 230 uses too many output enables then the advice given at step 480 could be for the designer to reduce the number of output enables used by the amount that exceeded the maximum number, etc. In the preferred embodiment, process 260 returns at this point. However, in an alternative embodiment, as shown in FIG. 4C, step 490 may check if a re-run flag is set. If so, the user has specified a full debug option and, in this case, step 330 (FIG. 4A) may be entered, otherwise process 260 may return.

At step 330 of FIG. 4B, an embodiment of the present invention checks if a PLD (second PLD) may be available that is more dense (e.g., larger) than the first PLD but has the same pin package as the first PLD. The larger device need not be an actual product, but could be a "virtual device." This virtual device could have a variable number of macrocells, logic blocks, clusters, etc., with a varied number of specific architectural features. By allowing a larger virtual device, an embodiment of the invention can increase/decrease the number of features then provide useful information in determining not only what features are violated but also the number of features required.

If there exists no larger device than the one on which fitting fails, or where a larger device exists, but does not share the same pin package as the first device, then the following option may be available. A "virtual device" that shares the same architecture as the device under consideration, that has a variable number of logic blocks, PTs per LB, OTs per LB etc., can be used. In this case, the number of each of these features can be varied and a refit performed on the virtual device. This allows a fitting failure to be debugged (e.g., due to many OEs required) by using a virtual device on which the number of PEs is varied until fitting is successful.

If such a second PLD is available, then step 340 may be entered, otherwise step 420 of FIG. 4B may be entered. At step 340, the present invention causes process 240 to perform a second fitting on the PLD design 230 but applies the second fitting to the second PLD (e.g., the larger device). At step 350, a determination may be made if the second fitting generated any fitting problems. If no fitting problems were found, then the second fitting completed successfully and step 360 may be entered, otherwise, step 370 may be entered. At step 370, a notification is generated to the user that the debug process 260 has failed to generate a fitting solution and that technical support should be contacted. Process 260 then may return.

At step 360, an embodiment of the present invention back-annotates the pin assignment generated by the second fitting to the PLD design 230 thereby using this pin assignment as a fitting constraint for the PLD design 230. Process 240 then may execute a third fitting on the PLD design 230, as constrained by the pin assignment, and this third fitting may be applied to the first PLD (e.g., the smaller device).

Step 390 of FIG. 4B may then be entered. At step 390, a check is made if the third fitting was successful. If so, then at step 460, a report may be made to the user that the PLD design fitted properly to the first PLD and the programming file generated by process 240 is stored in computer memory or hard disk etc. Optionally, at step 460, a bug report can be generated and sent, e.g., electronically mailed, to the technical support server 270, indicating that the fit did not work the first time and steps can be taken to attempt to fit. Debug process 260 then may return.

At step 390 of FIG. 4C, if the third fitting was not successful, then at step 410 a check may be made if new architectural violations are flagged that were not present at step 320. If so, then step 380 may be entered. At step 380, an embodiment of the present invention identifies these new architectural violations and may generate a report of these including solution advice. Step 380 is somewhat analogous to step 480 but is concerned with new architectural violations. Debug process 260 then may return. At step 410, if new architectural violations are not present then step 420 may be entered.

At step 420 of FIG. 4B, a check may be made to determine if any specific named pins are failing to fit. If not, then step 430 may be entered. At step 430, a notification may be generated to the user that the debug process 260 has failed to generate a fitting solution and that technical support should be contacted. Process 260 then may return. If specific named pins are failing to fit, then step 440 may be entered. At step 440, if these pins have not been locked down (e.g., pin locked) by the designer, then step 450 may be entered, otherwise step 430 may be entered. At step 450, the fitting process 240 is operated using the first PLD and the pin assignment discovered from the third fitting, however, the named failed pins are allowed to float, e.g., they can be reassigned to different pin locations. Namely, process 260 automatically floats these pins individually and fitting is performed for a fourth (or more) times. Specifically, at step 450, the an embodiment of the present invention attempts to re-fit automatically with individual pins, pins with similar functionality e.g., dedicated inputs, and groups of failing pins, etc.

At step 470, if step 450 locates a pin assignment that fit successfully and is acceptable to the user, then step 460 may be entered, otherwise step 430 may be entered.

It is appreciated that process 260 can be customized by one or more user options. For instance, if the user does not want pins to float in the debug process, then the user can set a user flag (e.g., true/false) regarding this option. Alternatively, if the user wants the process 260 to automatically try fitting on a larger PLD, then a flag can be set indicating that these functions should be performed. Table I illustrates an exemplary user interface that can be applied in accordance with the present invention.

TABLE I

| Sreen Display | Flag |
| --- | --- |
| "Floating Pins Allowed" | True/False |
| "Inform User of Architectural Violations" | True/False |
| "Advise on How to Fix Architectural Violations" | True/False |
| "Inform If Larger PLD Fits" | True/False |
| "Use Virtual Device to Attempt to Fit" | True/False |

The preferred embodiment of the present invention, an automatic proactive debugging process and system for fitting problems that arise in the programming of a programmable logic device, is thus described. While the present invention has been described in particular embodiments, it should be appreciated that the present invention should not be construed as limited by such embodiments, but rather construed according to the below claims.

What is claimed is:

1. A method of debugging fitting problems comprising the steps of:
   a) in response to a hardware design failing a first fitting on a first programmable device, automatically selecting a second programmable device having more resources than said first programmable device but having a same pin package;
   b) automatically performing a second fitting of said hardware design on said second programmable device which, if successful, yields a determined pin assignment; and
   c) automatically performing a third fitting of said hardware design on said first programmable device and constrained by said determined pin assignment.

2. A method as described in claim 1 further comprising the step of before performing step a), automatically reporting any discovered architectural violations and their suggested solutions.

3. A method as described in claim 2 wherein said first and second programmable devices are complex programmable logic devices (CPLDs) and 5further comprising the step of automatically generating a report of the result of step c).

4. A method as described in claim 2 further comprising the steps of:
   provided said third fitting generates fitting problems, identifying select pins that fail fitting; and
   provided said select pins that fail fitting are not locked down, automatically performing a fourth fitting of said hardware design on said first programmable device and constrained by said determined pin assignment but floating said select pins that fail fitting.

5. A method as described in claim 4 further comprising the step of automatically generating a report of the result of said fourth fitting.

6. A method as described in claim 2 further comprising the steps of:
   provided said third fitting generates fitting problems, identifying any newly discovered architectural violations; and
   automatically reporting said any newly discovered architectural violations and their suggested solutions.

7. A method as described in claim 2 further comprises the step of generating a programming file for any fitting that completes on said first programmable device without fitting problems.

8. A computer implemented method of debugging fitting problems comprising the steps of:
   a) in response to an programmable logic device (PLD) design failing a first fitting on a first programmable device, automatically selecting a second programmable device having more resources than said first programmable device but having a same pin package;
   b) automatically performing a second fitting of said PLD design on said second programmable device which, if successful, yields a determined pin assignment;
   c) automatically performing a third fitting of said PLD design on said first programmable device and constrained by said determined pin assignment; and
   d) provided said third fitting generates fitting problems, automatically performing a fourth fitting of said PLD design on said first programmable device and constrained by said determined pin assignment but allowing failing pins to float.

9. A method as described in claim 8 further comprising the step of automatically reporting any discovered architectural violations and their suggested solutions.

10. A method as described in claim 8 wherein said first and second programmable devices are complex programmable logic devices (CPLDs) and further comprising the step of automatically generating a report of the result of step c).

11. A method as described in claim 8 wherein step d) comprises the steps of:
    d1) provided said third fitting is not successful, identifying select pins that fail fitting and that are not locked down; and
    d2) automatically performing a fourth fitting of said PLD design on said first programmable device and constrained by said determined pin assignment but floating said select pins that fail fitting and are not locked down.

12. A method as described in claim 11 further comprising the step of automatically generating a report of the result of said fourth fitting.

13. A method as described in claim 8 further comprising the steps of:
    provided said third flitting generates fitting problems, identifying any newly discovered architectural violations; and
    automatically reporting said any newly discovered architectural violations and their suggested solutions.

14. A system comprising a processor coupled to a bus and memory coupled to said bus wherein said memory contains processor instructions for implementing a method of debugging fitting problems, said method comprising the steps of:
    a) in response to an programmable logic device (PLD) design failing a first fitting on a first programmable device, automatically selecting a second programmable device having more resources than said first programmable device but having a same pin package;
    b) automatically performing a second fitting of said PLD design on said second programmable device which, if successful, yields a determined pin assignment; and
    c) automatically performing a third fitting of said PLD design on said first programmable device and constrained by said determined pin assignment.

15. A system as described in claim 14 wherein said method further comprises the step of automatically reporting any discovered architectural violations and their suggested solutions.

16. A system as described in claim 15 wherein said first and second programmable devices are complex programmable logic devices (CPLDs) and wherein said method further comprises the step of automatically generating a report of the result of step c).

17. A system as described in claim 15 wherein said method further comprises the steps of:
    provided said third fitting generates fitting problems, identifying select pins that fail fitting; and
    provided said select pins that fail fitting are not locked down, automatically performing a fourth fitting of said PLD design on said first programmable device and constrained by said determined pin assignment but floating said select pins that fail fitting.

18. A system as described in claim 17 wherein said method further comprises the step of automatically generating a report of the result of said fourth fitting.

19. A system as described in claim 15 wherein said method further comprises the steps of:
provided said third fitting generates fitting problems, identifying any newly discovered architectural violations; and automatically reporting said any newly discovered architectural violations and their suggested solutions.

20. A system as described in claim 15 wherein said method further comprises the step of generating a programming file for any fitting that completes on said first programmable device without fitting problems.

\* \* \* \* \*